US007902020B2

(12) United States Patent
Park

(10) Patent No.: US 7,902,020 B2
(45) Date of Patent: Mar. 8, 2011

(54) SEMICONDUCTOR DEVICE AND METHOD OF MANUFACTURING THE SAME

(75) Inventor: Il-Yong Park, Seo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/571,468

(22) Filed: Oct. 1, 2009

(65) Prior Publication Data

US 2010/0084708 A1    Apr. 8, 2010

(30) Foreign Application Priority Data

Oct. 6, 2008    (KR) .................. 10-2008-0097637

(51) Int. Cl.
*H01L 21/8249*    (2006.01)
*H01L 21/38*    (2006.01)

(52) U.S. Cl. ......... 438/227; 438/228; 438/231; 438/247; 438/305; 438/549; 257/335; 257/336; 257/371; 257/343; 257/408; 257/E21.417; 257/E21.642; 257/E21.644

(58) Field of Classification Search ........... 257/E21.417, 257/E21.642, E21.644
See application file for complete search history.

(56) References Cited

U.S. PATENT DOCUMENTS 6,902,959 B2 *    6/2005    Kim et al. .................... 438/141
2010/0032758 A1 *    2/2010    Wang et al. .................. 257/343

FOREIGN PATENT DOCUMENTS

KR    10-2006-0022996    3/2006
KR    10-2008-0017634    2/2008

* cited by examiner

*Primary Examiner* — Charles D Garber
*Assistant Examiner* — Mohsen Ahmadi
(74) *Attorney, Agent, or Firm* — Sherr & Vaughn, PLLC

(57) ABSTRACT

A semiconductor device includes a first conductivity-type deep well formed in a substrate, a plurality of device isolation layers formed in the substrate in which the first conductivity-type deep well is formed, a second conductivity-type well formed on a portion of the first conductivity-type deep well between two of the device isolation layers, a first gate pattern formed over a portion of the second conductivity-type well, a second gate pattern formed over one of the device isolation layers, a source region formed in an upper surface of the second conductivity-type well to adjoin a first side of the first gate pattern, a first drain region formed to include the interface between an upper surface of the second conductivity-type well adjoining a second side of the first gate pattern and an upper surface of the first conductivity-type deep well adjoining the second side of the first gate pattern, and a second drain region formed in an upper surface of the first conductivity-type deep well to be spaced from the second conductivity-type well.

20 Claims, 5 Drawing Sheets

SEMICONDUCTOR DEVICE AND METHOD OF MANUFACTURING THE SAME

Figure 1:
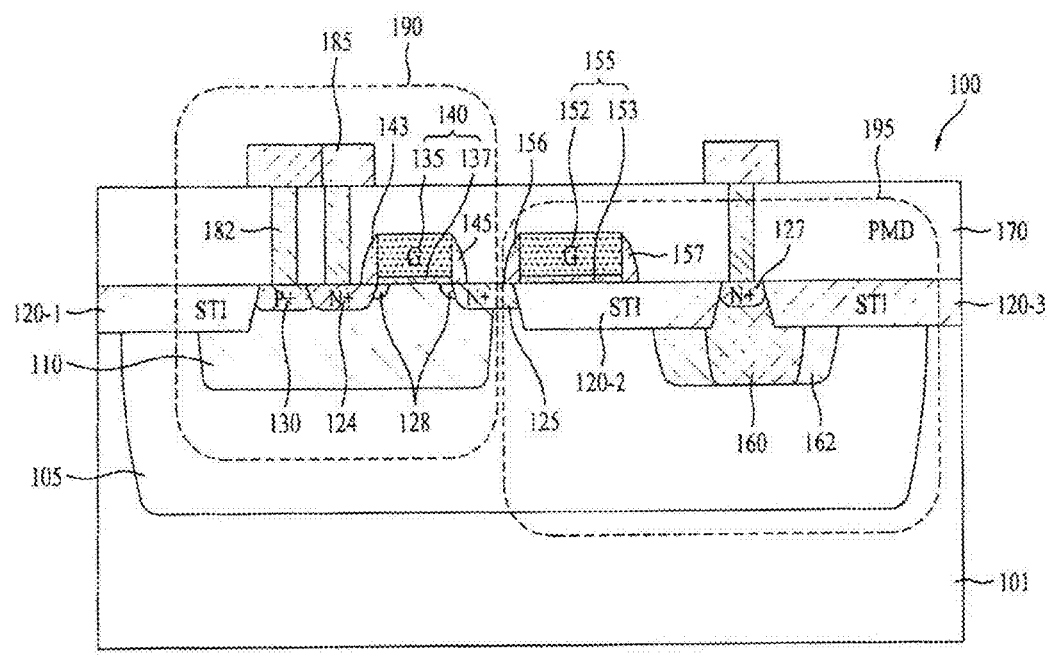

The present application claims priority under 35 U.S.C. 119 to Korean Patent Application No. 10-2008-0097637 (filed on Oct. 6, 2008), which is hereby incorporated by reference in its entirety.

BACKGROUND

A lateral double diffused metal-oxide semiconductor (LDMOS), as a majority carrier device, may serve as a power device capable of fast switching response and high input impedance. Since the LDMOS may be used as a switching device, it requires a short channel length to drive a high current. Also, to withstand high voltage, the LDMOS needs to be designed with a high doping density in the P-type body so that punch-through breakdown is not caused by a reverse bias.

A channel may be produced by implanting boron into a P-type body region, implanting arsenic into a substrate using a single mask, and then performing a thermal treatment. Here, the length of the channel is determined by the difference in diffusion rates between boron and arsenic, which in turn is dependent on temperature and the time of the thermal treatment. Punch-through breakdown can be avoided by adjusting the implantation concentration at the P-type body, even though the channel is very short.

A doping profile in the channel region is not uniform since the doping concentration is high in a source region, while the doping concentration is low at an end of the channel. The channel length may not be varied because the channel doping profile is not uniform. Therefore, the size of the channel may be adjusted only by controlling a gate width.

SUMMARY

Embodiments relate to a semiconductor device, and more particularly, to a lateral double diffused metal-oxide semiconductor (LDMOS) device. Embodiments relate to a semiconductor device having a channel with a uniform length and self-aligned with a gate, and a method of manufacturing the same.

Embodiments relate to a semiconductor device which includes a first conductivity-type deep well formed in a substrate, a plurality of device isolation layers formed in the substrate in which the first conductivity-type deep well is formed, a second conductivity-type well formed on a portion of the first conductivity-type deep well between two of the device isolation layers, a first gate pattern formed over a portion of the second conductivity-type well, a second gate pattern formed over one of the device isolation layers, a source region formed in an upper surface of the second conductivity-type well to adjoin a first side of the first gate pattern, a first drain region formed to include the interface between an upper surface of the second conductivity-type well adjoining a second side of the first gate pattern and an upper surface of the first conductivity-type deep well adjoining the second side of the first gate pattern, and a second drain region formed in an upper surface of the first conductivity-type deep well to be spaced from the second conductivity-type well.

Embodiments relate to a method of manufacturing a semiconductor device which includes forming a first conductivity-type deep well by implanting first conductivity-type impurity ions into a substrate, forming a second conductivity-type well in a part of the first conductivity-type deep well, by implanting second conductivity-type impurity ions into the substrate, forming device isolation layers on the substrate in which the first conductivity-type deep well and the second conductivity-type well are formed, forming a first gate pattern over a part of the second conductivity-type well and a second gate pattern over one of the device isolation layers, forming a source region in an upper surface of the second conductivity-type well, adjoining a first side of the first gate pattern, by implanting first conductivity-type impurity ions into the substrate, forming a first drain region to include the interface between an upper surface of the second conductivity-type well, which adjoins a second side of the first gate pattern, and an upper surface of the first conductivity-type deep well, by implanting first conductivity-type impurity ions into the substrate, and forming a second drain region in an upper surface of the first conductivity-type deep well at an interval from the second conductivity-type well, by implanting first conductivity-type impurity ions into the substrate.

DRAWINGS

Example FIG. 1 is a sectional view of a semiconductor device according to embodiments.

Figure 2:
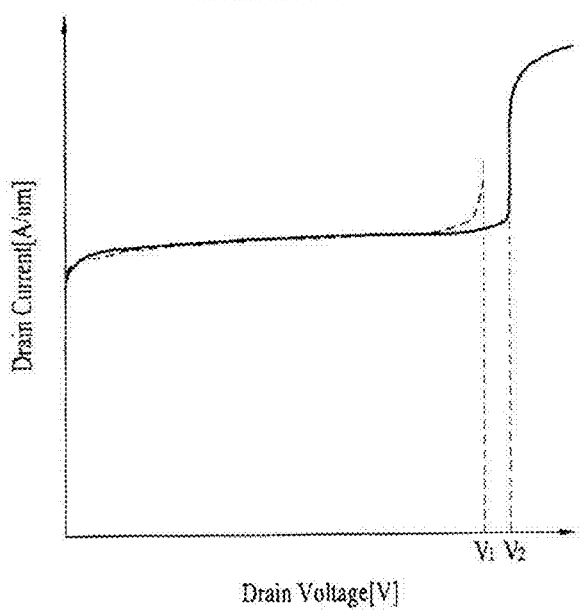

Example FIG. 2 comparatively shows breakdown voltage characteristics of a related lateral double diffused metal-oxide semiconductor (LDMOS) and the LDMOS of embodiments shown in example FIG. 1.

Figure 3:
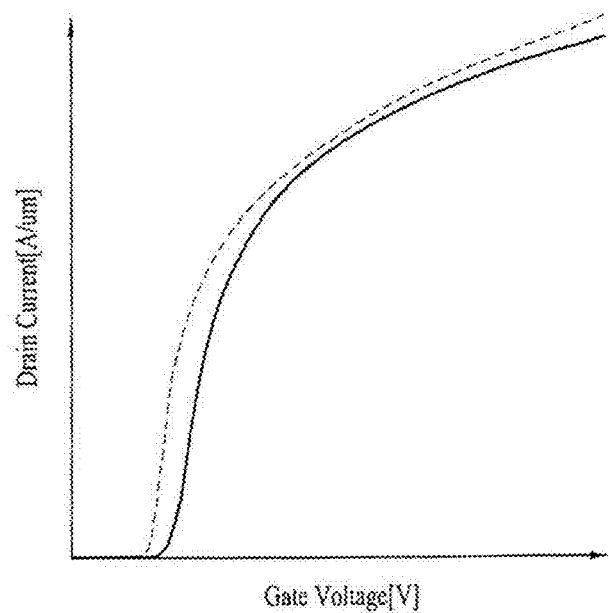

Example FIG. 3 shows the relations between a drain current and a gate voltage of the related LDMOS and the LDMOS shown in example FIG. 1.

Figure 4A:
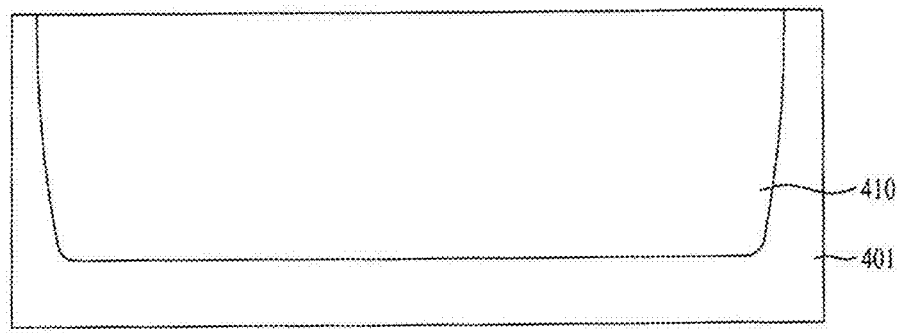
Figure 4B:
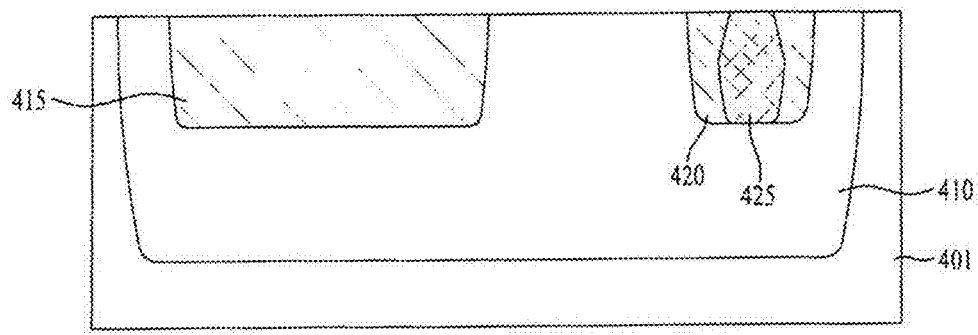
Figure 4C:
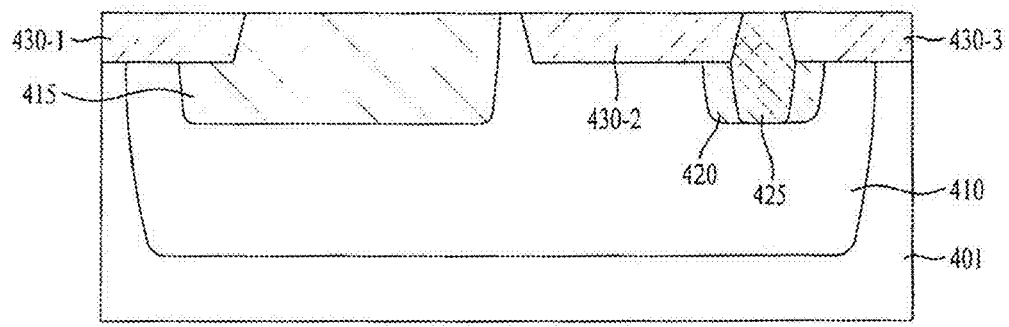
Figure 4D:
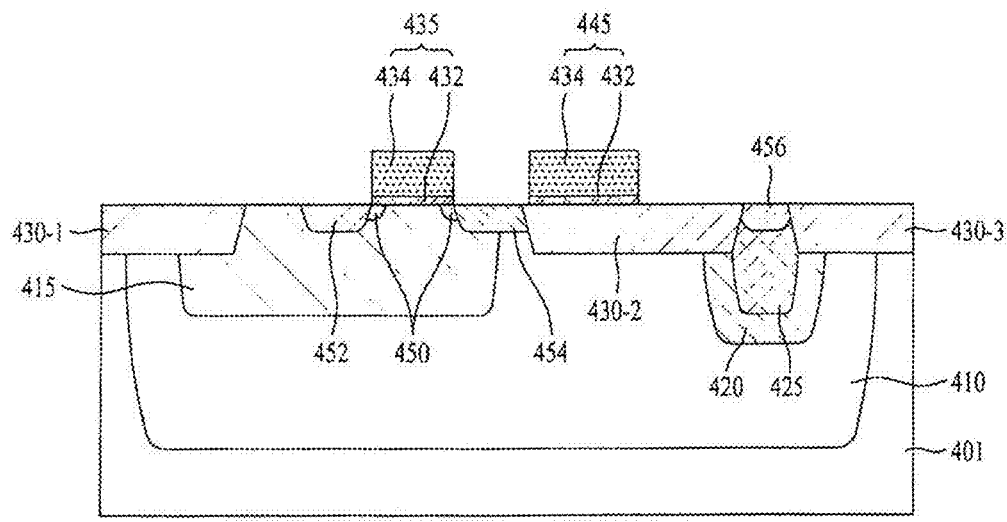
Figure 4E:
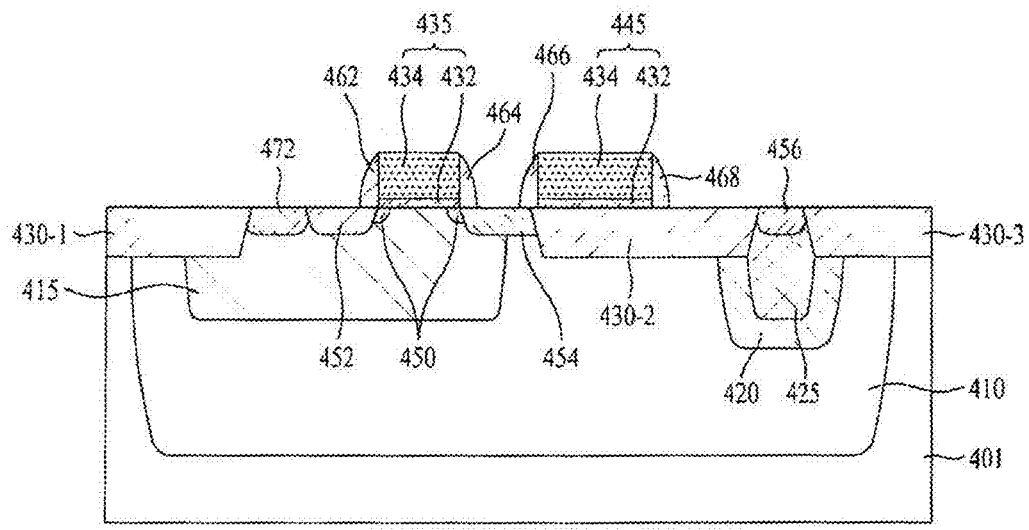
Figure 4F:
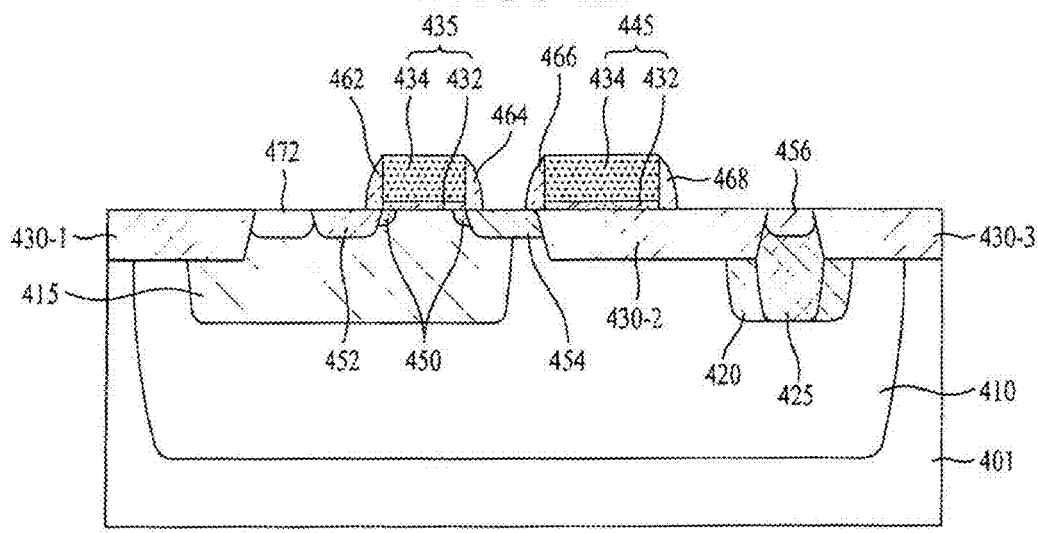
Figure 4G:
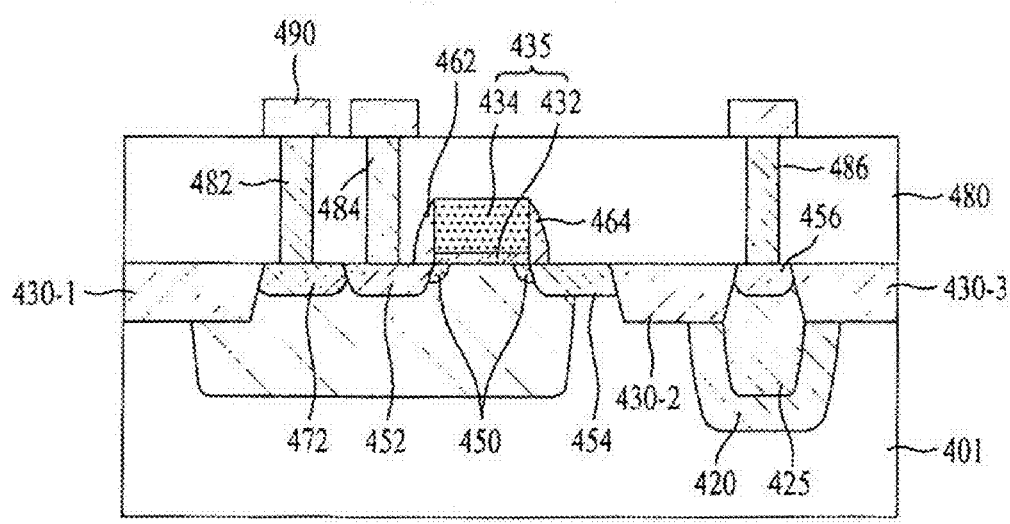

Example FIG. 4A to example FIG. 4G are sectional views illustrating a method of manufacturing the semiconductor device according to embodiments.

DESCRIPTION

Example FIG. 1 is a sectional view of a semiconductor device 100 according to embodiments. Referring to example FIG. 1, the semiconductor device 100 may include a substrate 101, a first conductivity-type deep well 105, a second conductivity-type well 110, device isolation layers 120-1, 120-2 and 120-3, a first gate pattern 140, a second gate pattern 155, a first conductivity-type source region 124, first conductivity-type lightly doped drain (LDD) regions 128, a second conductivity-type doping region 130, a first conductivity-type first drain region 125, a first conductivity-type second drain region 127, a first conductivity-type drift region 162 and a first conductivity-type well 160, an interlayer dielectric 170, contacts 182, and metal lines 185.

The substrate 101 may be a P-type epitaxial layer. The first conductivity-type deep well 105 may be formed by selectively implanting first conductivity-type (for example, N-type) impurity ions into the substrate 101. The second conductivity-type (for example, P-type) well 110 may be formed on a part of the first conductivity-type deep well 105, by selectively implanting second conductivity-type impurity ions into the first conductivity-type deep well 105.

The device isolation layers 120-1, 120-2 and 120-3 may be formed in the substrate 101 to separate devices, for example, including a first device isolation layer 120-1, a second device isolation layer 120-2 and a third device isolation layer 120-3. The first gate pattern 140 may be formed over a part of the second conductivity-type well 110. The second gate pattern 155 may be formed over any one of the device isolation layers, for example, over the second device isolation layer 120-2.

The first gate pattern 140 and the second gate pattern 155 may have a laminated structure including a gate electrode 135 over a gate oxide layer 137, and a laminated structure including a gate electrode 152 over a gate oxide layer 153, respectively. Here, a first spacer 143 and a second spacer 145 may be formed. The first spacer 143 may cover one sidewall of the first gate pattern 140 and a part of the first conductivity-type source region 124. The second spacer 145 may cover the other sidewall of the first gate pattern 140 and a part of the first conductivity-type first drain region 125.

In addition, a third spacer 156 may be formed to cover one sidewall of the second gate pattern 155 and another part of the first conductivity-type first drain region 125. A fourth spacer 157 may be formed to cover the other sidewall of the second gate pattern 155 and a part of the second device isolation layer 120-2.

The first conductivity-type source region 124 may be formed in an upper surface of the second conductivity-type well 110 to adjoin one side of the first gate pattern 140. The second conductivity-type doping region 130 may be formed in the upper surface of the second conductivity-type well 110 to adjoin the first conductivity-type source region 124. For instance, the second conductivity-type doping region 130 may be formed in the upper surface of the second conductivity-type well 110 between the first conductivity-type source region 124 and the first device isolation layer 120-1.

The first conductivity-type first drain region 125 may be formed in the interface region between the upper surface of the second conductivity-type well 110 adjoining the other side of the first gate pattern 140, and the upper surface of the first conductivity-type deep well 105 adjoining the other side of the first gate pattern 140. For instance, the first conductivity-type first drain region 125 may be formed to cover the upper surfaces of the second conductivity-type well 110 and the first conductivity-type deep well 105 between the other side of the first gate pattern and the second device isolation layer 120-2.

The first conductivity-type LDD regions 128 may be formed to overlap with a part of the first gate pattern 140 adjoining the first conductivity-type source region 124 and another part of the first gate pattern 140 adjoining the first conductivity-type first drain region 125.

The first conductivity-type second drain region 127 may be formed in an upper surface of the first conductivity-type deep well 105, being spaced apart from the second conductivity-type well 110. For example, the first conductivity-type second drain region 127 may be formed in the upper surface of the first conductivity-type deep well 105 between the second device isolation layer 120-2 and the third device isolation layer 120-3, and spaced apart from the second conductivity-type well 110 by the second device isolation layer 120-2. Here, at least one of the first conductivity-type drift region 162 and the first conductivity-type well 160 may be formed at a lower part of the first conductivity-type second drain region 127 in the first conductivity-type deep well 105.

The interlayer dielectric 170 is formed over the substrate 101 having the above-described components. The contacts 182 are connected to the second conductivity-type doping region 130, the first conductivity-type source region 124, the first conductivity-type first drain region 125 and the first conductivity-type second drain region 127, by penetrating the interlayer dielectric 170. The metal lines 185 are formed over the interlayer dielectric 170, each to contact a corresponding one of the contacts 182.

Thus, a first conductivity-type MOS 190, for example, a first NMOS includes the substrate 101, the first conductivity-type deep well 105, the second conductivity-type well 110, the first gate pattern 140, the first conductivity-type source region 124, the second conductivity-type doping region 130, the first conductivity-type first drain region 125. Also, a resistor 195 is constituted by the first conductivity-type deep well 105, the first conductivity-type first drain region 125, the second gate pattern 155, the first conductivity-type second drain region 127, the first conductivity-type drift region 162 and the first conductivity-type well 160.

Thus, the LDMOS 100 according to the embodiment is a combination of the NMOS 190 and the resistor 195. Since a channel of the LDMOS 100 may be formed in the NMOS structure 190, the doping concentration of the channel region is as uniform as the NMOS 190. The first conductivity-type first drain region 125 corresponding to a drain of the NMOS 190 may be formed so as to include the interface between the second conductivity-type well 110 and the first conductivity-type deep well 105. That is, electrons supplied from the first conductivity-type source region 124 to the first conductivity-type first drain region 125 through the channel may be supplied to the first conductivity-type deep well 105 through the first conductivity-type first drain region 125.

Example FIG. 2 shows characteristics of breakdown voltages of a related LDMOS and the LDMOS according to the embodiment shown in example FIG. 1. The breakdown voltage of the related LDMOS is shown as a dotted line, and the breakdown voltage of the LDMOS of example FIG. 1 is shown as a solid line.

Referring to example FIG. 2, the breakdown voltage V1 of the related LDMOS may be almost the same as the breakdown voltage V2 of the LDMOS of example FIG. 1. Also, a drain current of the related LDMOS and a drain current of the LDMOS of example FIG. 1 may be equivalent to each other.

Example FIG. 3 shows the relations between the drain voltage and the gate voltage of the related LDMOS and the LDMOS of the embodiment shown in example FIG. 1. Referring to example FIG. 3, the related LDMOS and the LDMOS of example FIG. 1 may have very similar characteristics in terms of the breakdown voltage and on-resistance.

Example FIGS. 4A to 4G are sectional views illustrating a method of manufacturing the semiconductor device according to embodiments. As shown in example FIG. 4A, first, a silicon substrate 401 may be prepared which may include an epitaxial growth layer. Here, the epitaxial layer 401 may be a P-type epitaxial layer doped with P-type impurity ions. Next, impurity ions of the first conductivity-type, for example N-type, may be selectively implanted into the silicon substrate 401, thereby forming a first conductivity-type deep well 410.

Next, as shown in example FIG. 4B, impurity ions of the second conductivity-type, for example P-type, may be selectively implanted into the silicon substrate 401, thereby forming a second conductivity-type well 415. In addition, the first conductivity-type impurity ions may be selectively implanted into the silicon substrate 401, thereby forming at least one of a first conductivity-type well 425 and a first conductivity-type drift region 420 on another region of the first conductivity-type deep well 410 to be spaced from the second conductivity-type well 415. If the first conductivity-type well 425 and the conductivity-type drift region 420 are both formed, the first conductivity-type drift region 420 may be formed to surround the first conductivity-type well 425.

As shown in example FIG. 4C, next, a device isolation region may be formed in the silicon substrate 401 on which the first conductivity-type deep well 410, the second conductivity-type well 415, the first conductivity-type well 425 and the first conductivity-type drift region 420 are formed. The device isolation region may include a first device isolation layer 430-1, a second device isolation layer 430-2 and a third device isolation layer 430-3.

As the device isolation region is formed, the second conductivity-type well 415 may be formed at a part of the first conductivity-type deep well 410 between the first and the second device isolation layers 430-1 and 430-2. The first conductivity-type well 425 may be formed in another part of the first conductivity-type deep well 410 between the second and the third device isolation layers 430-2 and 430-3. The first conductivity-type drift region 420 may be formed in yet another part of the first conductivity-type deep well 410 around the first conductivity-type well 425 at lower parts of the second and the third device isolation layers 430-2 and 430-3.

As shown in example FIG. 4D, next, a first gate pattern 435 may be formed over the second conductivity-type well 415. A second gate pattern 445 may be formed over the second device isolation layer 430-2. Here, the first gate pattern 435 and the second gate pattern 445 may both have a laminated structure of a gate oxide layer 432 and a gate electrode 434. For example, the laminated gate pattern structure including the gate oxide layer 432 and the gate electrode 434 may be formed by vapor-depositing an oxide layer and a gate poly over the entire surface of the substrate 401, and patterning the oxide layer and the gate poly through photolithography and etching processes.

Next, the first conductivity-type impurity ions may be implanted selectively into the silicon substrate 401, thereby forming first conductivity-type LDD regions 450 in the second conductivity-type P-type well 415 to be overlapped with both sides of the first gate pattern 435. In addition, the first conductivity-type impurity ions may be selectively implanted into the silicon substrate 401, thereby forming a first conductivity-type source region 452 in an upper surface of the second conductivity-type well 415 to adjoin one side of the first gate pattern 432.

The first conductivity-type impurity ions may be implanted selectively into the silicon substrate 401, thereby forming a first conductivity-type first drain region 454 in the region including the interface between the upper surface of the second conductivity-type well 415, which adjoins the other side of the first gate pattern 435, and an upper surface of the first conductivity-type deep well 410. For example, the first conductivity-type first drain region 454 may be formed to include the interface between the upper surfaces of the second conductivity-type well 415 and the first conductivity-type deep well 410, and to be disposed between the other side of the first gate pattern 435 and the second device isolation layer 430-2.

Additionally, the first conductivity-type impurity ions may be implanted selectively into the silicon substrate 401, thereby forming a first conductivity-type second drain region 456 in an upper surface of the first conductivity-type well 425. The first conductivity-type source region 452, the first conductivity-type first drain region 454 and the first conductivity-type second drain region 456 may be formed simultaneously, by selectively implanting the first conductivity-type impurity ions into the silicon substrate 401 using one mask.

Next, as shown in example FIG. 4E, second conductivity-type impurity ions may be implanted selectively into the silicon substrate 401, thereby forming a second conductivity-type doping region 472 in the upper surface of the second conductivity-type well 415 adjoining the first conductivity-type source region 452. For example, the second conductivity-type doping region 472 may be disposed in the upper surface of the second conductivity-type well 415 between the first conductivity-type source region 452 and the first device isolation layer 430-1.

Next, as shown in example FIG. 4F, spacers 462, 464, 466 and 468 may be formed over sidewalls of the first gate pattern 435 and the second gate pattern 445, respectively. More specifically, the spacers 462, 464, 466 and 468 may be formed by vapor-depositing a dielectric layer over the silicon substrate 401 over which the first gate pattern 435 and the second gate pattern 445 are formed, and etching back the vapor-deposited dielectric layer.

Next, as shown in example FIG. 4G, an interlayer dielectric 480 may be formed through Chemical Vapor Deposition (CVD) over the substrate 401 over which the above parts are formed. Contact holes may be formed through the interlayer dielectric 480. The contact holes may expose the second conductivity-type doping region 472, the first conductivity-type source region 452, the first conductivity-type first drain region 454 and the first conductivity-type second drain region 456. Metal may be embedded in the contact holes, thereby forming the metal contacts 482, 484 and 486. Next, metal lines 490 may be formed over the interlayer dielectric 480 each to contact a corresponding one of the metal contacts 482, 484 and 486.

As apparent from the above description, in accordance with a semiconductor device and a method of manufacturing the same according to the above-described embodiments, a channel can be formed to have uniform length regardless of the breakdown voltage and the on-resistance characteristics, and the channel can be self-aligned with a gate.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a first conductivity-type deep well formed in a substrate;
a plurality of device isolation layers formed in the substrate in which the first conductivity-type deep well is formed;
a second conductivity-type well formed on a portion of the first conductivity-type deep well between two of the device isolation layers;
a first gate pattern formed over a portion of the second conductivity-type well;
a second gate pattern formed over one of the device isolation layers;
a source region formed in an upper surface of the second conductivity-type well to adjoin a first side of the first gate pattern;
a first drain region formed to include the interface between an upper surface of the second conductivity-type well adjoining a second side of the first gate pattern and an upper surface of the first conductivity-type deep well adjoining the second side of the first gate pattern; and
a second drain region formed in an upper surface of the first conductivity-type deep well to be spaced from the second conductivity-type well.

2. The apparatus of claim 1, including:
a second conductivity-type doping region formed in an upper surface of the second conductivity-type well adjoining the source region.

3. The apparatus of claim 1, wherein the device isolation layers include a first device isolation layer, a second device isolation layer, and a third device isolation layer.

4. The apparatus of claim 3, wherein the second conductivity-type well is formed in a portion of the first conductivity-type deep well between the first and the second device isolation layers.

5. The apparatus of claim 3, wherein the second conductivity-type well is formed in a part of the first conductivity-type deep well between the second and the third device isolation layers.

6. The apparatus of claim 5, including a first conductivity-type well formed in the first conductivity-type deep well.

7. The apparatus of claim 6, wherein the second drain region is formed in the first conductivity-type well.

8. The apparatus of claim 3, wherein the first drain region is formed to include an interface between upper surfaces of the second conductivity-type well and the first conductivity-type deep well.

9. The apparatus of claim 3, including:
a first spacer covering a first sidewall of the first gate pattern and a part of the first source region;
a second spacer covering the a second sidewall of the first gate pattern and a first part of the first drain region;
a third spacer covering a first sidewall of the second gate pattern and a second part of the first drain region; and
a fourth spacer covering the second sidewall of the second gate pattern and a part of the second device isolation layer.

10. The apparatus of claim 1, including:
first conductivity-type lightly doped drain regions formed to overlap with a part of the first gate pattern adjoining the source region, and a part of the first gate pattern adjoining the first drain region.

11. The apparatus of claim 1, wherein the source region, and the first and the second drain regions are of a first conductivity type.

12. A method comprising:
forming a first conductivity-type deep well by implanting first conductivity-type impurity ions into a substrate;
forming a second conductivity-type well in a part of the first conductivity-type deep well, by implanting second conductivity-type impurity ions into the substrate;
forming device isolation layers on the substrate in which the first conductivity-type deep well and the second conductivity-type well are formed;
forming a first gate pattern over a part of the second conductivity-type well and a second gate pattern over one of the device isolation layers;
forming a source region in an upper surface of the second conductivity-type well, adjoining a first side of the first gate pattern, by implanting first conductivity-type impurity ions into the substrate;
forming a first drain region to include the interface between an upper surface of the second conductivity-type well, which adjoins a second side of the first gate pattern, and an upper surface of the first conductivity-type deep well, by implanting first conductivity-type impurity ions into the substrate; and
forming a second drain region in an upper surface of the first conductivity-type deep well at an interval from the second conductivity-type well, by implanting first conductivity-type impurity ions into the substrate.

13. The method of claim 12, wherein the source region, the first drain region and the second drain region are simultaneously formed using one mask.

14. The method of claim 12, including:
forming a second conductivity-type doping region in an upper surface of the second conductivity-type well adjoining the source region, by implanting second conductivity-type impurity ions into the substrate.

15. The method of claim 12, wherein the forming of the device isolation layers is performed by forming first, second and third device isolation layers in the substrate in which the first conductivity-type deep well and the second conductivity-type well are formed.

16. The method of claim 15, wherein the second conductivity-type well is formed in a part of the first conductivity-type deep well between the first device isolation layer and the second device isolation layer.

17. The method of claim 12, including:
forming a first conductivity-type well in a second part of the first conductivity-type deep well at an interval from the second conductivity-type well, by implanting first conductivity-type impurity ions into the substrate.

18. The method of claim 17, wherein the second drain region is formed in the first conductivity-type well.

19. The method of claim 15, wherein the first drain region is formed to include the interface between the upper surfaces of the second conductivity-type well and the first conductivity-type deep well, and to be disposed between the second side of the first gate pattern and the second device isolation layer.

20. The method of claim 15, including:
forming a first spacer covering a first sidewall of the first gate pattern and a part of the first source region;
forming a second spacer covering a second sidewall of the first gate pattern and a first part of the first drain region;
forming a third spacer covering a first sidewall of the second gate pattern and a second part of the first drain region; and
forming a fourth spacer covering a second sidewall of the second gate pattern and a part of the second device isolation layer.

* * * * *